US012656410B2

(12) United States Patent
Yoshida et al.

(10) Patent No.: US 12,656,410 B2
(45) Date of Patent: Jun. 16, 2026

(54) GROUND FAULT DETECTION APPARATUS, CONTROL METHOD THEREOF, AND CONTROL PROGRAM

(71) Applicant: Yazaki Corporation, Tokyo (JP)

(72) Inventors: Haruhiko Yoshida, Makinohara (JP); Yasuyuki Mochizuki, Makinohara (JP); Ryosuke Arigaya, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 179 days.

(21) Appl. No.: 18/802,664

(22) Filed: Aug. 13, 2024

(65) Prior Publication Data

US 2025/0076410 A1 Mar. 6, 2025

(30) Foreign Application Priority Data

Aug. 29, 2023 (JP) ................................. 2023-138686

(51) Int. Cl.
| | |
|---|---|
| *G01R 31/52* | (2020.01) |
| *G01R 27/14* | (2006.01) |
| *G01R 27/18* | (2006.01) |
| *G01R 31/00* | (2006.01) |
| *G01R 31/02* | (2006.01) |
| *H01J 7/00* | (2006.01) |
| *H02J 7/80* | (2026.01) |

(52) U.S. Cl.
CPC ................ *G01R 31/52* (2020.01); *H02J 7/80* (2026.01); *G01R 31/007* (2013.01)

(58) Field of Classification Search
CPC ........ G01R 31/00; G01R 31/02; G01R 31/52; G01R 27/14; G01R 27/18; H02J 7/00
See application file for complete search history.

(56) References Cited

U.S. PATENT DOCUMENTS 12,174,230 B2 * 12/2024 Nakagawa ............. G01R 31/52

FOREIGN PATENT DOCUMENTS

JP 2004-170103 A 6/2004

* cited by examiner

*Primary Examiner* — Neel D Shah
(74) *Attorney, Agent, or Firm* — Sughrue Mion, PLLC

(57) ABSTRACT

A ground fault detection apparatus is configured to perform a detection for a decrease in an insulation resistance in a measurement cycle in which a fluctuation of a second charging voltage as a charging voltage of a first capacitor that is charged in a second charging route in which the first capacitor is connected between a cathode of the battery and the ground is determined to be less than a second threshold value, and a fluctuation of a third charging voltage as the charging voltage of the first capacitor that is charged in a third charging route in which the first capacitor is connected between an anode of the battery and the ground is determined to be less than a third threshold value.

10 Claims, 10 Drawing Sheets

FIG. 8

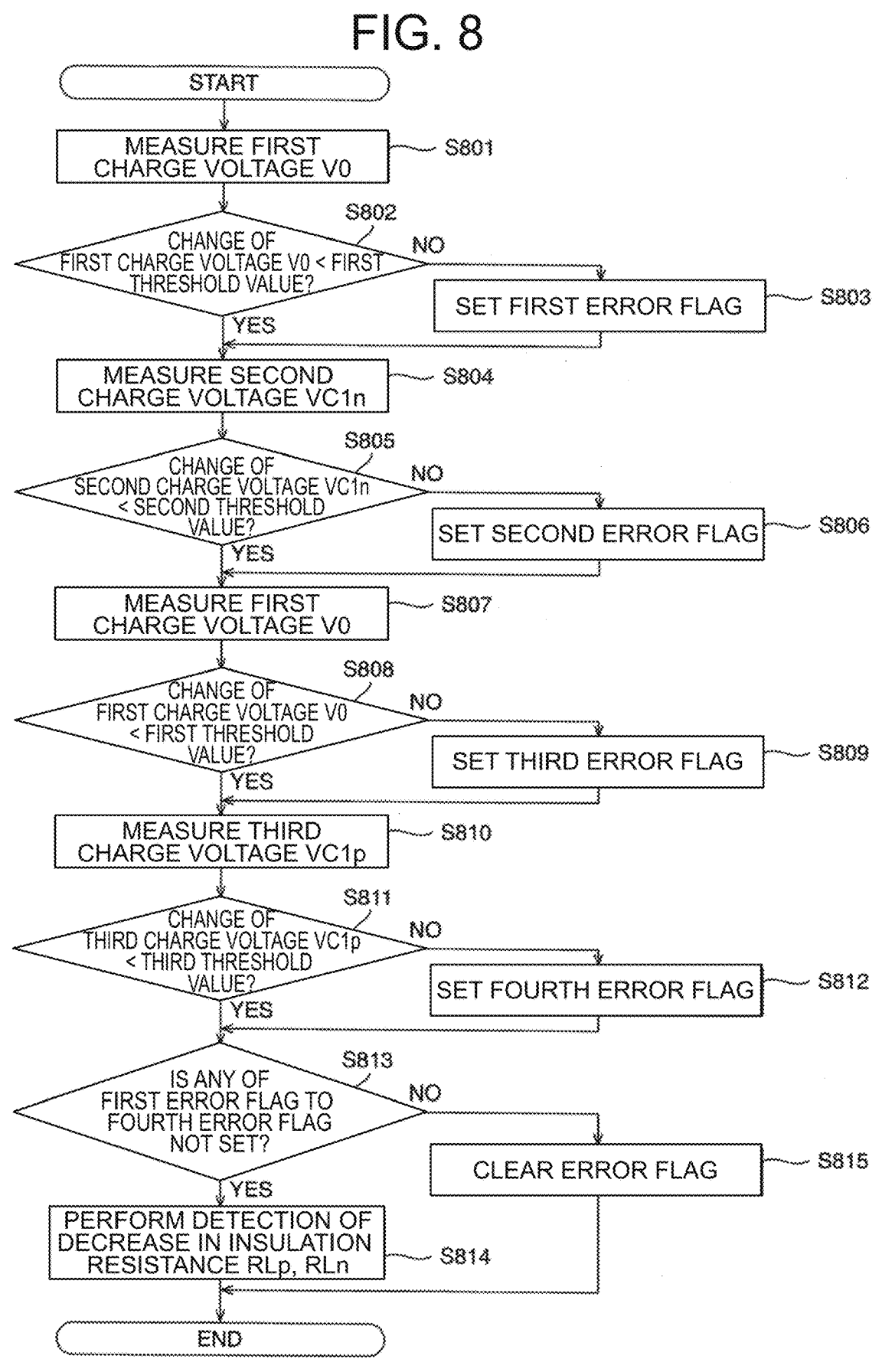

START

MEASURE FIRST
CHARGE VOLTAGE V0 — S801

CHANGE OF
FIRST CHARGE VOLTAGE V0 < FIRST
THRESHOLD VALUE? — S802

NO → SET FIRST ERROR FLAG — S803

YES

MEASURE SECOND
CHARGE VOLTAGE VC1n — S804

CHANGE OF
SECOND CHARGE VOLTAGE VC1n
< SECOND THRESHOLD
VALUE? — S805

NO → SET SECOND ERROR FLAG — S806

YES

MEASURE FIRST
CHARGE VOLTAGE V0 — S807

CHANGE OF
FIRST CHARGE VOLTAGE V0
< FIRST THRESHOLD
VALUE? — S808

NO → SET THIRD ERROR FLAG — S809

YES

MEASURE THIRD
CHARGE VOLTAGE VC1p — S810

CHANGE OF
THIRD CHARGE VOLTAGE VC1p
< THIRD THRESHOLD
VALUE? — S811

NO → SET FOURTH ERROR FLAG — S812

YES

IS ANY OF
FIRST ERROR FLAG TO
FOURTH ERROR FLAG
NOT SET? — S813

NO → CLEAR ERROR FLAG — S815

YES

PERFORM DETECTION OF
DECREASE IN INSULATION
RESISTANCE RLp, RLn — S814

END

FIG. 9

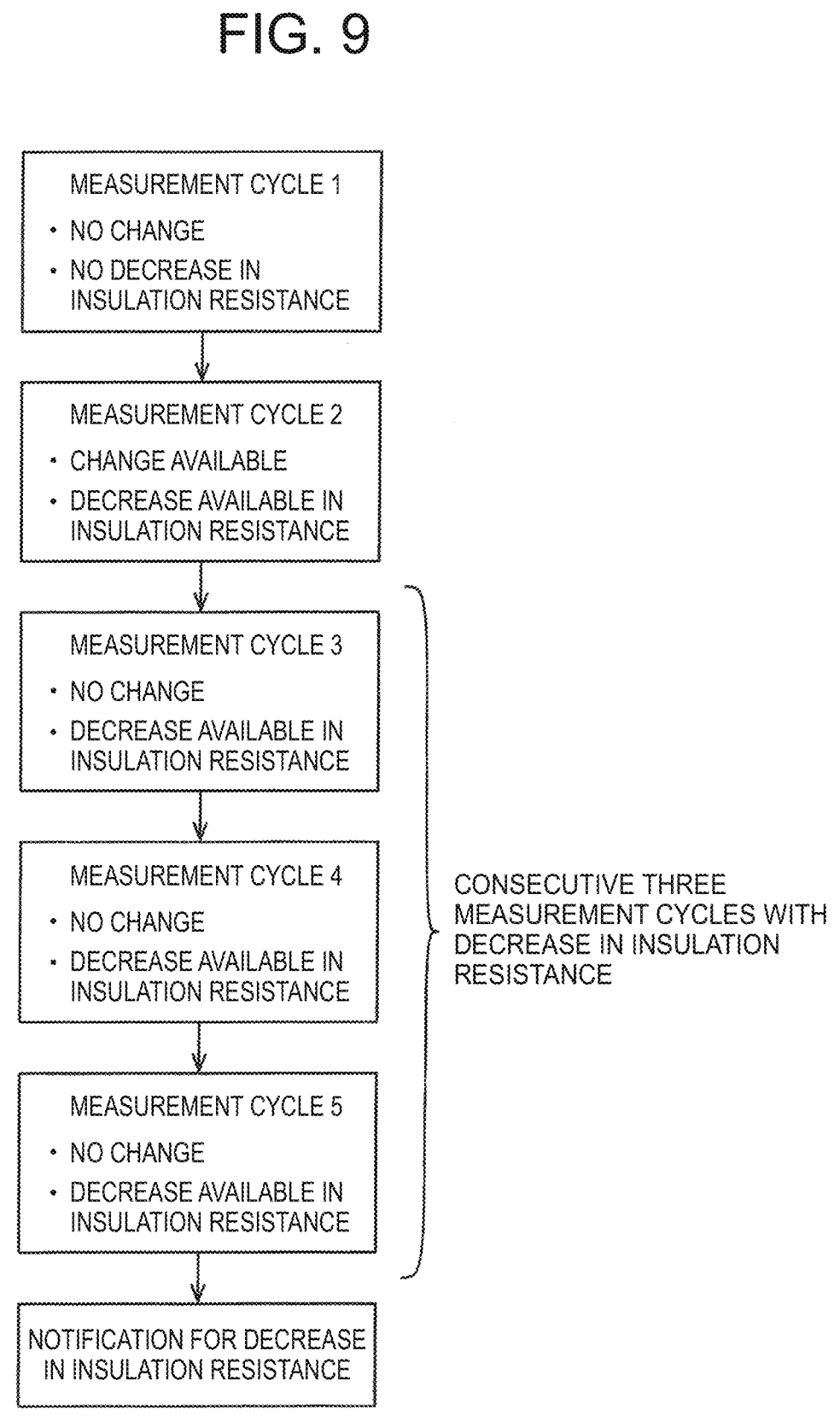

MEASUREMENT CYCLE 1

• NO CHANGE

• NO DECREASE IN INSULATION RESISTANCE

↓

MEASUREMENT CYCLE 2

• CHANGE AVAILABLE

• DECREASE AVAILABLE IN INSULATION RESISTANCE

↓

MEASUREMENT CYCLE 3

• NO CHANGE

• DECREASE AVAILABLE IN INSULATION RESISTANCE

↓

MEASUREMENT CYCLE 4

• NO CHANGE

• DECREASE AVAILABLE IN INSULATION RESISTANCE

↓

MEASUREMENT CYCLE 5

• NO CHANGE

• DECREASE AVAILABLE IN INSULATION RESISTANCE

↓

NOTIFICATION FOR DECREASE IN INSULATION RESISTANCE

CONSECUTIVE THREE MEASUREMENT CYCLES WITH DECREASE IN INSULATION RESISTANCE

FIG.10

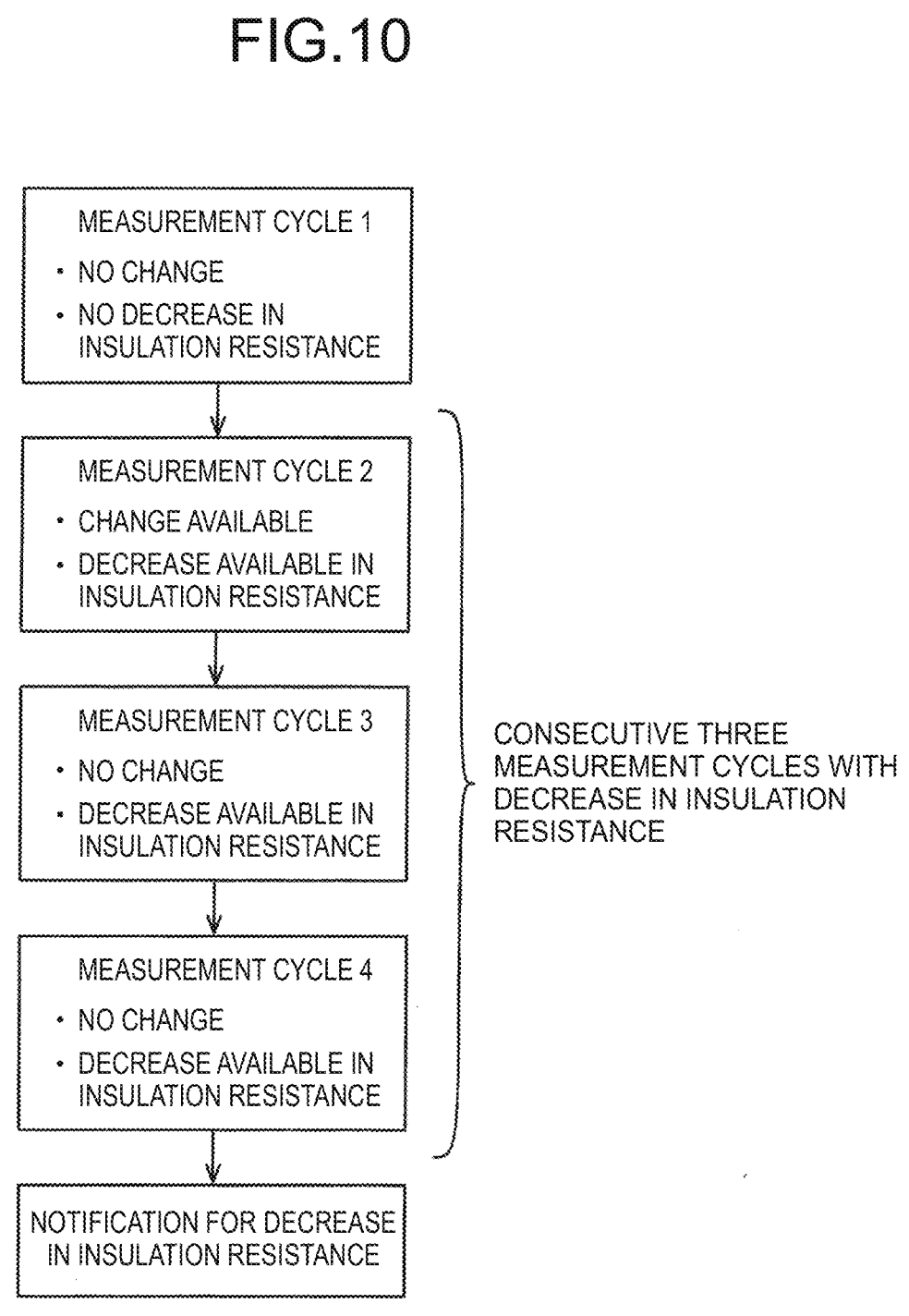

MEASUREMENT CYCLE 1

- NO CHANGE
- NO DECREASE IN INSULATION RESISTANCE

MEASUREMENT CYCLE 2

- CHANGE AVAILABLE
- DECREASE AVAILABLE IN INSULATION RESISTANCE

MEASUREMENT CYCLE 3

- NO CHANGE
- DECREASE AVAILABLE IN INSULATION RESISTANCE

MEASUREMENT CYCLE 4

- NO CHANGE
- DECREASE AVAILABLE IN INSULATION RESISTANCE

CONSECUTIVE THREE MEASUREMENT CYCLES WITH DECREASE IN INSULATION RESISTANCE

NOTIFICATION FOR DECREASE IN INSULATION RESISTANCE

GROUND FAULT DETECTION APPARATUS, CONTROL METHOD THEREOF, AND CONTROL PROGRAM

TECHNICAL FIELD

The present disclosure relates to a ground fault detection apparatus, a control method thereof and a non-volatile computer-readable recording medium recording a control program.

BACKGROUND ART

Recently, hybrid cars and electric cars are becoming popular. The hybrid cars and the electric cars are equipped with an electric motor and a battery that supplies power to the electric motor. The battery installed in the hybrid vehicles and electric vehicles is a high-voltage battery having a voltage equal to or more than 200V, and in order to ensure the safety thereof, it is necessary to make the battery to be electrically insulated from the vehicle body, which serves as a reference potential point for grounding. Therefore, the vehicles such as the hybrid cars and the electric cars are also equipped with a ground fault detection apparatus that detects a decrease in the insulation resistance between a system including the battery that is not grounded and the vehicle body.

As a ground fault detection apparatus, there is a flying capacitor type ground fault detection apparatus (for example, Patent Document 1). A flying capacitor type ground fault detection apparatus has a capacitor that operates as a flying capacitor, and the ground fault detection apparatus switches among a first charging route in which this capacitor is connected between the cathode and the anode of the battery without going through the ground; a second charging route in which the capacitor is connected between the cathode of the battery and the ground; a third charging route in which the capacitor is connected between the anode of the battery and the ground; and a measurement route for measuring the charging voltage of the first capacitor so as to perform the charging of the capacitor and the measurement for the charging voltage of the capacitor, and detect a decrease in the insulation resistance based on this measured charging voltage of the capacitor.

CITATION LIST

Patent Documents

Patent Document 1 JP 2004-170103A

SUMMARY OF THE INVENTION

Technical Problem

In a situation in which there is a rapid fluctuation in charging voltage of the battery, a decrease in insulation resistance may be falsely detected even though the insulation resistance has not decreased, or a decrease in insulation resistance may not be detected even though insulation resistance has decreased.

Accordingly, an object of the present invention is to accurately detect the decrease in the insulation resistance.

Solution to Problem

In order to solve the above-identified technical problem, a ground fault detection apparatus according to an embodiment of the present application is a ground fault detection apparatus for detecting a decrease in an insulation resistance of a system including a battery that is not grounded, wherein the ground fault detection apparatus includes a first capacitor; a switching portion configured to switch among a first charging route in which the first capacitor is connected between a cathode and an anode of the battery without being connected to the ground, a second charging route in which the first capacitor is connected between the cathode of the battery and the ground, a third charging route in which the first capacitor is connected between the anode of the battery and the ground, and a measurement route for measuring a charging voltage of the first capacitor; and a control portion configured to control the switching portion to measure the charging voltage of the first capacitor, wherein the control portion is configured to for each measurement cycle, perform a determination regarding whether a fluctuation of a second charging voltage as the charging voltage of the first capacitor being charged by the second charging route is less than a second threshold value, and perform a determination regarding whether a fluctuation of a third charging voltage as the charging voltage of the first capacitor being charged by the third charging route is less than a third threshold value, and perform a detection for the decrease of the insulation resistance in the measurement cycle in which the fluctuation of the second charging voltage is determined to be less than the second threshold value and the fluctuation of the third charging voltage is determined to be less than the third threshold value.

A control method according to an embodiment of the present invention is a control method of a ground fault detection apparatus for detecting a decrease in an insulation resistance of a system including a battery that is not grounded, the control method being executed by a computer, wherein the ground fault detection apparatus includes a first capacitor; and a switching portion configured to switch among a first charging route in which the first capacitor is connected between a cathode and an anode of the battery without being connected to the ground, a second charging route in which the first capacitor is connected between the cathode of the battery and the ground, a third charging route in which the first capacitor is connected between the anode of the battery and the ground, and a measurement route for measuring a charging voltage of the first capacitor, and the control method includes a measurement step of controlling the switching portion to measure a charging voltage of the first capacitor; for each measurement cycle, a step of performing a determination regarding whether a fluctuation of a second charging voltage as the charging voltage of the first capacitor being charged by the second charging route is less than a second threshold value, and performing a determination regarding whether a fluctuation of a third charging voltage as the charging voltage of the first capacitor being charged by the third charging route is less than a third threshold value, and a step of detecting for the decrease of the insulation resistance in the measurement cycle in which the fluctuation of the second charging voltage is determined to be less than the second threshold value and the fluctuation of the third charging voltage is determined to be less than the third threshold value.

A non-volatile computer-readable recording medium recording a control program according to an embodiment of the present invention causes the above-identified information processing method to be executed by a computer.

Effect of the Invention

According to the present invention, it is possible to accurately perform a detection of the decrease in the insulation resistance.

BRIEF DESCRIPTION OF THE DRAWINGS

FIG. 8 is an example of the processing operations executed in the ground fault detection apparatus 100 for each measurement cycle.

FIG. 9 is a view describing a notification of a decrease in the insulation resistances RLp, RLn.

FIG. 10 is a view describing the notification of a decrease in the insulation resistances RLp, RLn.

DESCRIPTION OF EMBODIMENTS

<Ground Fault Detection Apparatus 100>

Figure 1:
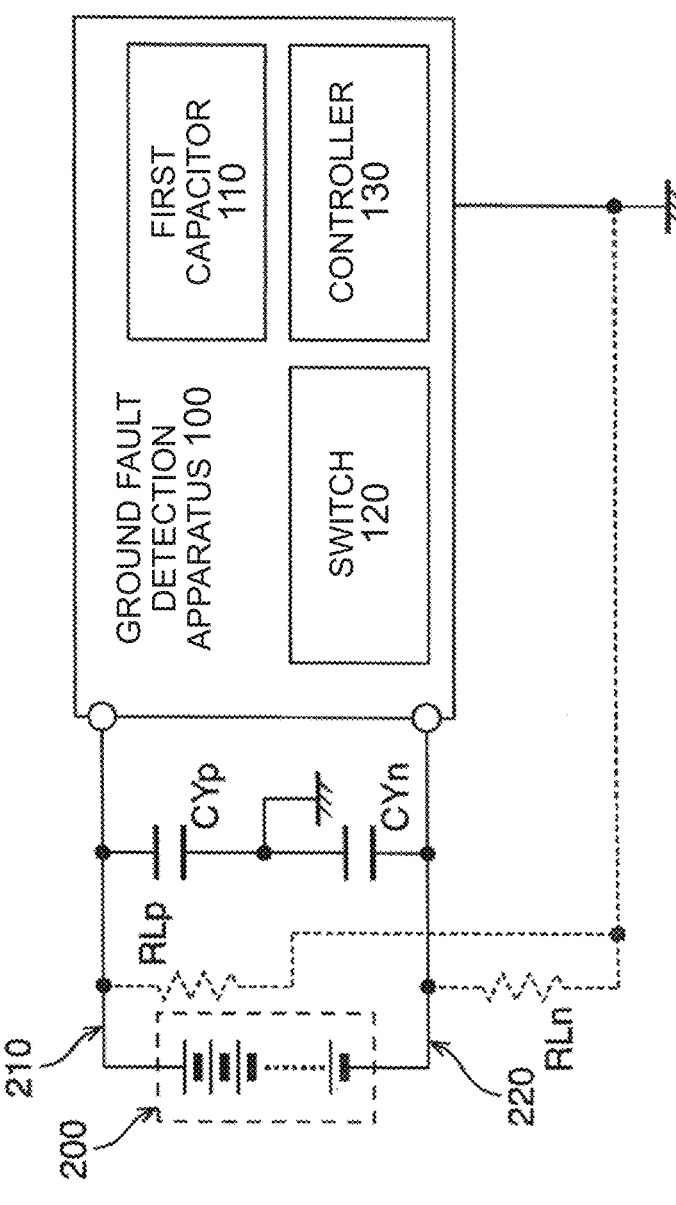
FIG. 1 is a view showing a ground fault detection apparatus 100 according to an embodiment of the present invention.

FIG. 1 is a view showing a ground fault detection apparatus 100 according to an embodiment of the present invention. The ground fault detection apparatus 100 is a flying-capacitor type of ground fault detection apparatus which is connected to a battery 200 that is not grounded to detect a decrease in an insulation resistance of a system including the battery 200. Here, the insulation resistance between a cathode side of the battery 200 and the ground is referred to as a cathode-side insulation resistance RLp, and the insulation resistance between an anode side of the battery 200 and the ground is referred to as an anode-side insulation resistance RLn.

The battery 200 is, for example, a battery for supplying electric power to the electric motor of the vehicle, and is a high voltage (for example, 200V or higher) battery. The battery 200 includes, for example, a plurality of rechargeable batteries (for example, the lithium-ion batteries). The cathode side of the battery 200 is connected to a cathode-side power line 210, and the anode side of the battery 200 is connected to an anode-side power line 220.

A system including the battery 200 is connected with an Y capacitor for decreasing the noise due to the common mode. In the example shown in FIG. 1, a cathode-side Y capacitor CYp is connected between the cathode-side power line 210 and the ground, and an anode-side Y capacitor CYn is connected between the anode-side power line 220 and the ground. The cathode-side Y capacitor CYp includes the stray capacity between the cathode-side power line 210 and the ground, and the anode-side Y capacitor CYn includes the stray capacity between the anode-side power line 220 and the ground.

The ground fault detection apparatus 100 is connected to the cathode of the battery 200 via the cathode-side power line 210 and connected to the anode of the battery 200 via the anode-side power line 220. The ground fault detection apparatus 100 includes a first capacitor 110, a switching portion 120, and a control portion 130.

The first capacitor 110 is a capacitor having a first electrode plate and a second electrode plate and configured to operate as a flying capacitor.

The switching portion 120 is configured to switch among a first charging route where the first capacitor 110 is connected between the cathode and the anode of the battery 200 without being grounded, a second charging route where the first capacitor 110 is connected between the cathode of the battery 200 and the ground, a third charging route where the first capacitor 110 is connected between the anode of the battery 200 and the ground, and a measurement route for measuring the charging voltage of the first capacitor 110.

Regarding the first charging route, the first capacitor 110 is charged due to an electric current flowing through a closed circuit in which the cathode of the battery 200, the first capacitor 110, and the anode of the battery 200 are connected in series in this sequence without being grounded. Accordingly, in the first charging route, a first charging voltage V0 corresponding to the charging voltage of the battery 200 is charged to the first capacitor 110.

Regarding the second charging route, the first capacitor 110 is charged due to an electric current flowing through a closed circuit in which the cathode of the battery 200, the first capacitor 110, the anode-side insulation resistance RLn, and the anode of the battery 200 are connected in series in this sequence. Accordingly, in the second charging route, a second charging voltage VC1n reflecting the effect of the anode-side insulation resistance RLn is charged to the first capacitor 110.

Regarding the third charging route, the first capacitor 110 is charged due to an electric current flowing through a closed circuit in which the cathode of the battery 200, the cathode-side insulation resistance RLp, the first capacitor 110, and the anode of the battery 200 are connected in series in this sequence. Accordingly, in the third charging route, a third charging voltage VC1p reflecting the effect of the cathode-side insulation resistance RLp is charged to the first capacitor 110.

The control portion 130 is configured to measure the charging voltage of the first capacitor 110. The control portion 130, for example, controls the switching portion 120 to measure, in a measurement route, the first charging voltage V0 as the charging voltage of the first capacitor 110 that is charged by the first charging route, the second charging voltage VC1n as the charging voltage of the first capacitor 110 that is charged by the second charging route, and the third charging voltage VC1p as the charging voltage of the first capacitor 110 that is charged by the third charging route.

Then, the control portion 130 performs the detection of the decrease in the insulation resistances RLp, RLn (detection of the ground fault) based on the measured charging voltage of the first capacitor 110. For example, the control portion 130 detects the decrease in the insulation resistances RLp, RLn based on the first charging voltage V0, the second charging voltage VC1n, and the third charging voltage VC1p. At this time, the control portion 130, for example, measures the values of the insulation resistances RLp, RLn based on the charging voltage of the first capacitor 110 and then detects the decrease in the insulation resistances RLp, RLn based on the measured values of the insulation resistances RLp, RLn. For example, the control portion 130 is configured by a computer.

The control portion 130 detects the decrease of the insulation resistances RLp, RLn within each measurement cycle. That is, the control portion 130 repeats the measurement cycle for detecting the decrease of the insulation resistances RLp, RLn. At this time, the control portion 130, for example, measures the values of the insulation resistances RLp, RLn for each measurement cycle, and then detects the decrease of the insulation resistances RLp, RLn by comparing the values of the insulation resistances RLp, RLn which are measured during the current measurement cycle with the values of the insulation resistances RLp, RLn which are measured during the measurement cycle prior to the current measurement cycle (for example, the measurement cycle immediately before the current measurement cycle).

The measurement cycle includes a first measurement period (V0 measurement period) in which the first capacitor 110 is charged by the first charging route, and then the first charging voltage V0 as the charging voltage of the first capacitor 110 being charged by the first charging route is measured while discharging the first capacitor 110 by the measurement route, a second measurement period (VC1n measurement period) in which the first capacitor 110 is charged by the second charging route, and then the second charging voltage VC1n as the charging voltage of the first capacitor 110 being charged by the second charging route is measured while discharging the first capacitor 110 by the measurement route, and a third measurement period (VC1p measurement period) in which the first capacitor 110 is charged by the third charging route, and then the third charging voltage VC1p as the charging voltage of the first capacitor 110 being charged by the third charging route is measured while discharging the first capacitor 110 by the measurement route. In other words, for each measurement cycle, the control portion 130 measures the first charging voltage V0, the second charging voltage VC1n, and the third charging voltage VC1p, and then performs the detection of the decrease in the insulation resistances based on the measured first charging voltage V0, the second charging voltage VC1n, and the third charging voltage VC1p. During the measurement cycle, the above-described measurement period is realized, for example, in the sequence of the first measurement period, the second measurement period, the first measurement period, and the third measurement period.

When an abnormality occurs (for example, the timing when the decrease in the insulation resistances RLp, RLn is detected), the control portion 130 notifies the occurrence of the abnormality (for example, the decrease in the insulation resistances RLp, RLn). At this time, the control portion 130 may be configured to notify the occurrence of the abnormality by showing information indicating the occurrence of the abnormality using an indication apparatus showing the information (for example, a display and a lamp), or be configured to notify the occurrence of the abnormality by outputting a sound indicating the occurrence of the abnormality using an indication apparatus outputting the sound showing the information (for example, a speaker), or be configured to notify the occurrence of the abnormality by transmitting information indicating the occurrence of the abnormality to another apparatus (for example, a superior ECU (Electronic Control Unit)) using a communication apparatus to transmit the information to the other apparatus.

The control portion 130 may be configured to notify the values of the measured insulation resistances RLp, RLn. In this manner, it is possible for a person achieving the information by this notification and other apparatus achieving the information by this notification, rather than the control portion 130, to detect the decrease in the insulation resistances RLp, RLn.

<Configuration Example of Ground Fault Detection Apparatus 100>

Figure 2:
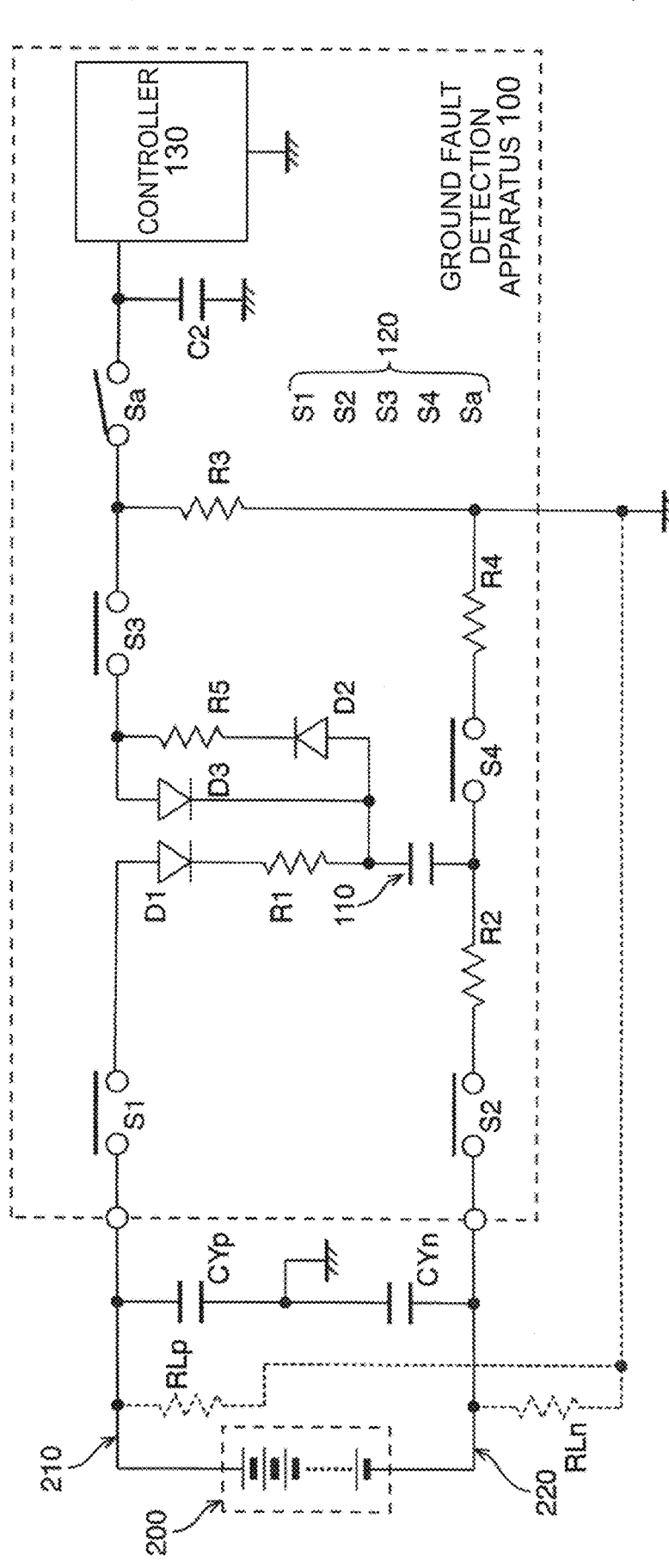
FIG. 2 is a view showing a configurational example of the ground fault detection apparatus 100.

For example, as shown in FIG. 2, the switching portion 120 may be configured to include four switches (a first switch S1, a second switch S2, a third switch S3, and a fourth switch S4). These four switches are insulation type of switching elements (for example, the optical MOSFET).

The first switch S1 is connected between the cathode of the battery 200 and a first electrode plate of the first capacitor 110. At this time, as shown in FIG. 2, the first switch S1 is connected to the first electrode plate of the first capacitor 110 via a first resistance R1. Also, a first diode D1 may be connected between the first switch S1 and the first resistance R1, or between the first resistance R1 and the first capacitor 110. A forward direction of the first diode D1 is a direction from the cathode of the battery 200 toward the first electrode plate of the first capacitor 110. In the configuration example shown in FIG. 2, the first diode D1 is connected between the first switch S1 and the first resistance R1.

The second switch S2 is connected between the anode of the battery 200 and a second electrode plate of the first capacitor 110. A second resistance R2 may be configured to be connected between the second switch S2 and a second electrode plate of the first capacitor 110, or between the second switch S2 and the anode of the battery 200. In the configuration example shown in FIG. 2, the second resistance R2 is connected between the second switch S2 and the second electrode plate of the first capacitor 110.

The third switch S3 is connected between the first electrode plate of the first capacitor 110 and the ground. At this time, as shown in FIG. 2, the third switch S3 is connected to the ground via a third resistance R3. Also, a second diode D2 and a third diode D3 may be connected in parallel between the third switch S3 and the first electrode plate of the first capacitor 110. The forward direction of the second diode D2 is a direction from the first electrode plate of the first capacitor 110 toward the third switch S3. The forward direction of the third diode D3 is a direction from the third switch S3 toward the first electrode plate of the first capacitor 110. Between the third switch S3 and the first electrode plate of the first capacitor 110, a fifth resistance R5 may be connected thereto in series with the second diode D2. In the configuration example shown in FIG. 2, the fifth resistance R5 is connected to the cathode side of the second diode D2.

The fourth switch S4 is connected between the second electrode plate of the first capacitor 110 and the ground. As shown in FIG. 2, the fourth switch S4 is connected to the ground via the fourth resistance R4.

Figure 3:
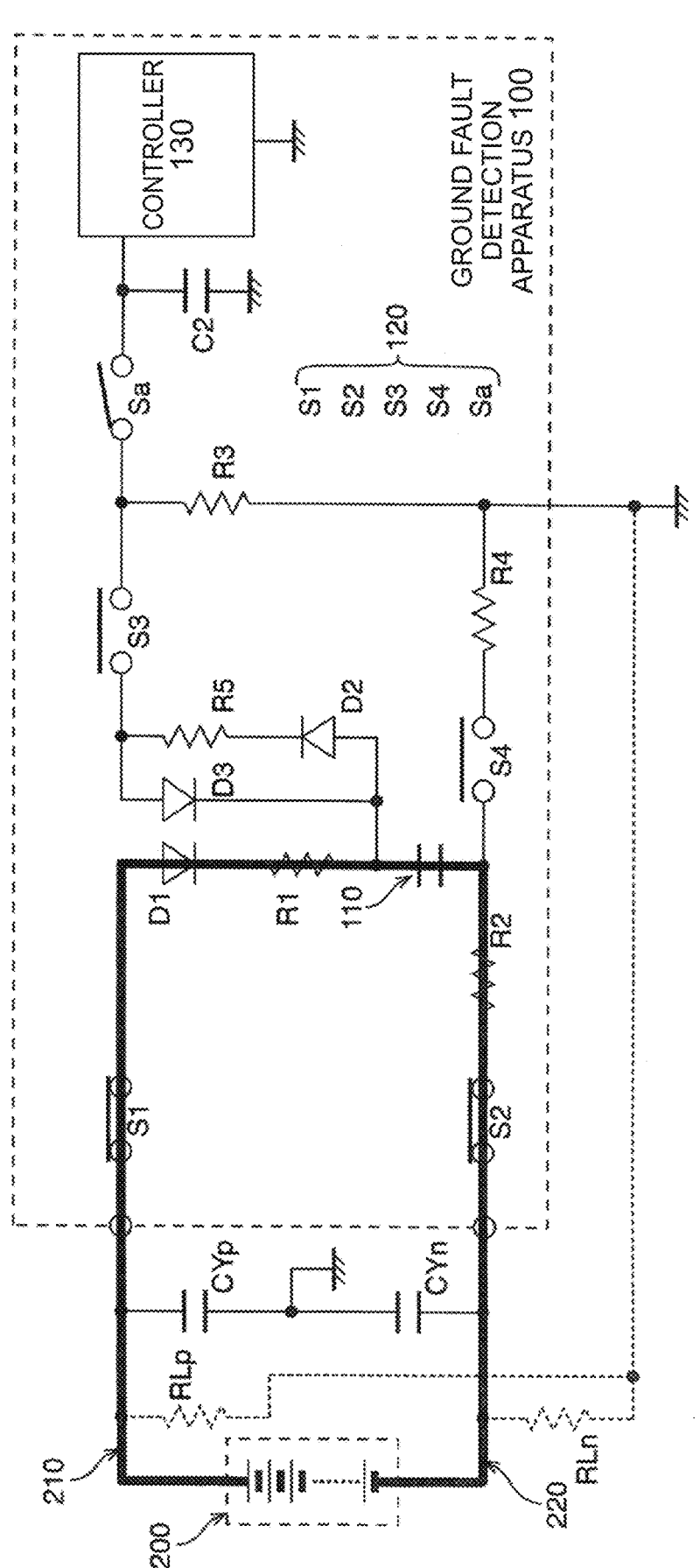
FIG. 3 is a view describing a first charging route.

Accordingly, in the configuration example shown in FIG. 2, when the first switch S1 and the second switch S2 are on, and the third switch S3 and the fourth switch S4 are off, as shown in FIG. 3, the first charging route, in which the first capacitor 110 is connected between the cathode and the anode of the battery 200 without being grounded, is formed. In the configuration example shown in FIG. 2, according to the first charging route, due to the closed circuit in which the cathode of the battery 200, the first switch S1, the first diode D1, the first resistance R1, the first capacitor 110, the second resistance R2, the second switch S2, and the anode of the battery 200 are connected in series and in this sequence, the first capacitor 110 is charged. Accordingly, regarding the first charging route, the first charging voltage V0 corresponding to the charging voltage of the battery 200 is charged on the first capacitor 110.

Figure 4:
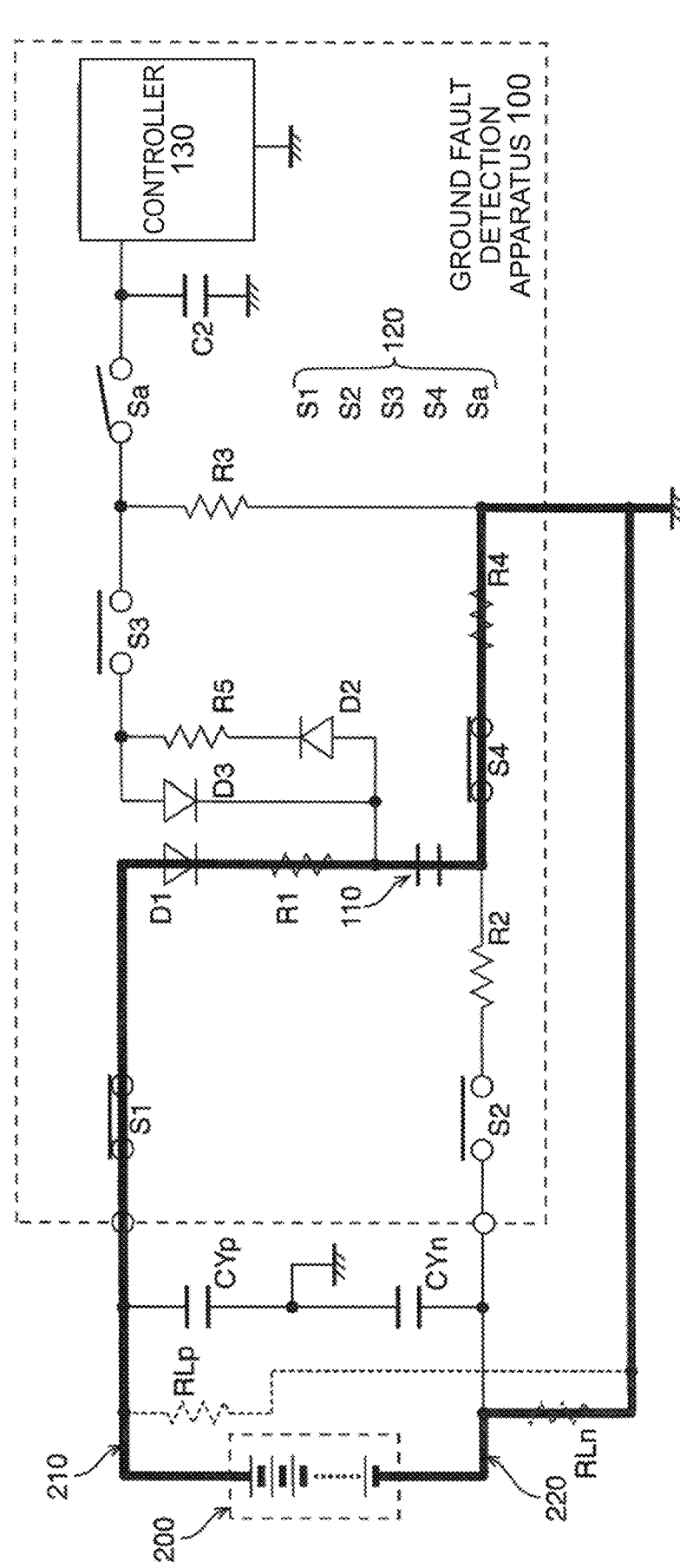
FIG. 4 is a view describing a second charging route.

Also, in the configuration example shown in FIG. 2, when the first switch S1 and the fourth switch S4 are on, and the second switch S2 and the third switch S3 are off, as shown in FIG. 4, the second charging route, in which the first capacitor 110 is connected between the cathode of the battery 200 and the ground, is formed. In the configuration example shown in FIG. 2, according to the second charging route, due to the closed circuit in which the cathode of the battery 200, the first switch S1, the first diode D1, the first resistance R1, the first capacitor 110, the fourth switch S4, the fourth resistance R4, the anode-side insulation resistance RLn, and the anode side of the battery 200 are connected in series and in this sequence, the first capacitor 110 is charged. Accordingly, in the second charging route, the second charging voltage VC1n reflecting the effect of the anode-side insulation resistance RLn of the battery 200 is charged on the first capacitor 110.

Figure 5:
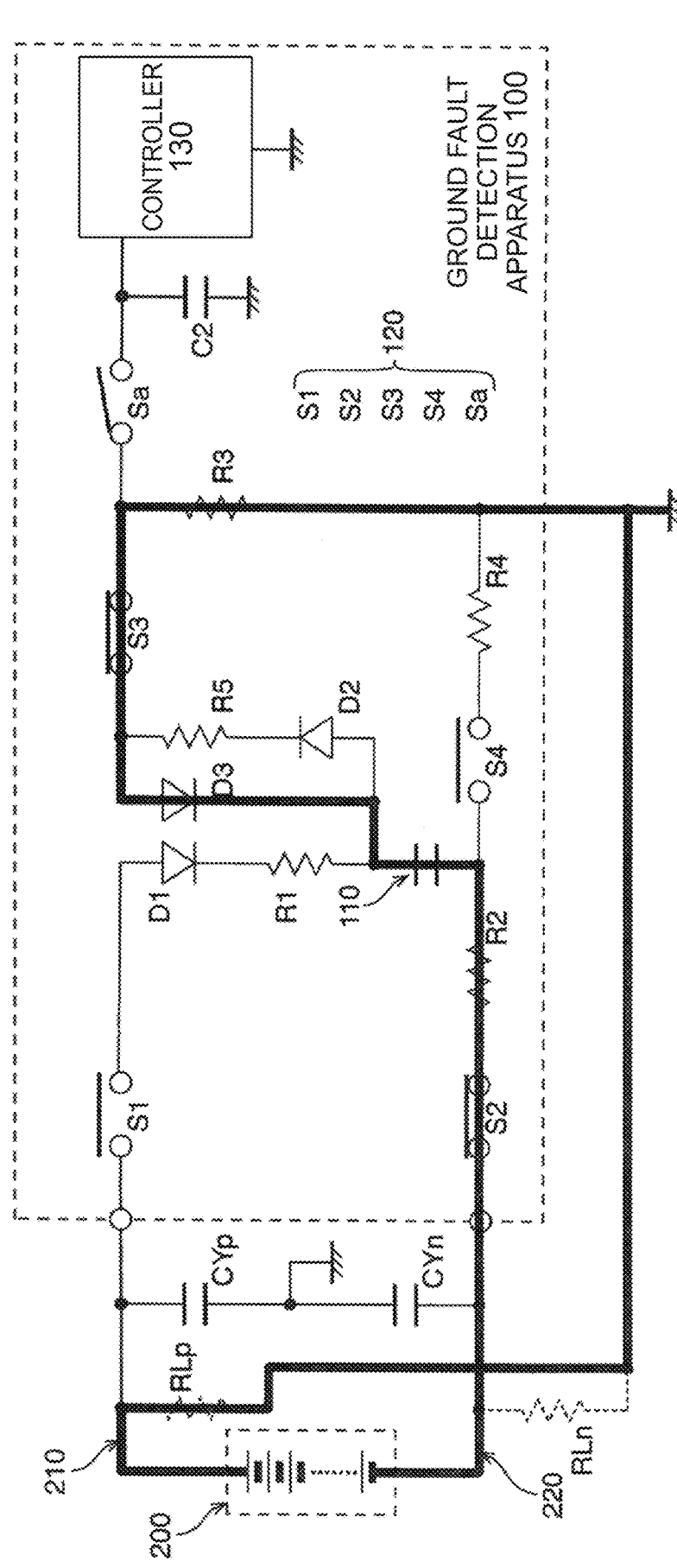
FIG. 5 is a view describing a third charging route.

In the configuration example shown in FIG. 2, when the second switch S2 and the third switch S3 are on, and the first switch S1 and the fourth switch S4 are off, as shown in FIG. 5, the third charging route, in which the first capacitor 110 is connected between the anode of the battery 200 and the ground, is formed. In the configuration example shown in FIG. 2, in the third charging route, due to the closed circuit in which the cathode of the battery 200, the cathode-side insulation resistance RLp, the third resistance R3, the third switch S3, the third diode D3, the first capacitor 110, the second resistance R2, the second switch S2, and the anode of the battery 200 are connected in series in this sequence, the first capacitor 110 is charged. Accordingly, in the third charging route, the third charging voltage VC1p reflecting the effect of the cathode-side insulation resistance RLp of the battery 200 is charged on the first capacitor 110.

Figure 6:
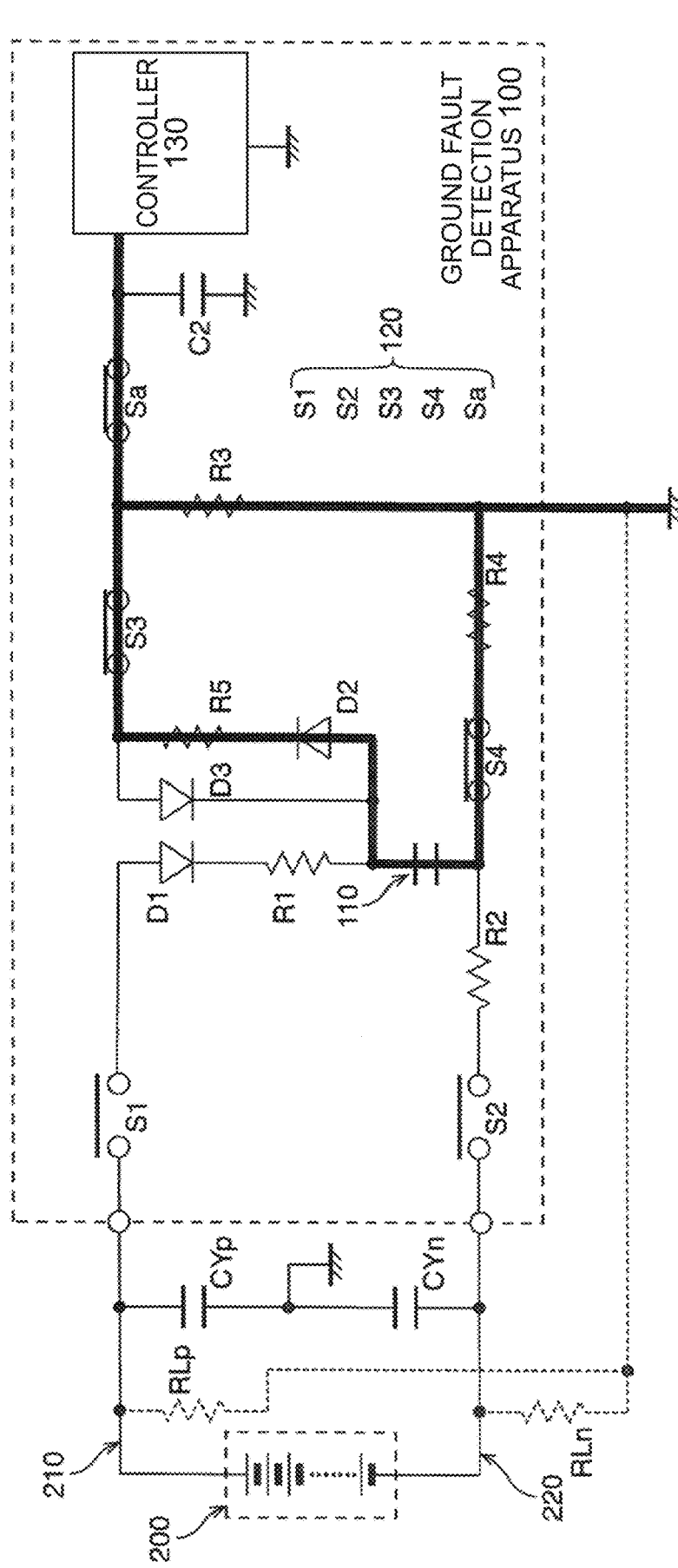
FIG. 6 is a view describing a measurement route.

As shown in FIG. 2, the control portion 130 is connected to the first electrode plate of the first capacitor 110 via the third switch S3. Accordingly, when the third switch S3 and the fourth switch S4 are on, and the first switch S1 and the second switch S2 are off, as shown in FIG. 6, the electric current flows from the first electrode plate of the first capacitor 110 to the control portion 130. Accordingly, it is possible for the control portion 130 to measure a charging voltage of a detection capacitor C1. That is, when the third switch S3 and the fourth switch S4 are on, and the first switch S1 and the second switch S2 are off, the measurement route for measuring the charging voltage of the first capacitor 110 is formed. As shown in FIG. 2, the line connecting the third switch S3 and the control portion 130 may be grounded via a second capacitor C2.

Also, as shown in FIG. 6, in the measurement route, the electric current flows from the first electrode plate to the second electrode plate of the first capacitor 110. Accordingly, in the measurement route, the first capacitor 110 is discharged.

Figure 7:
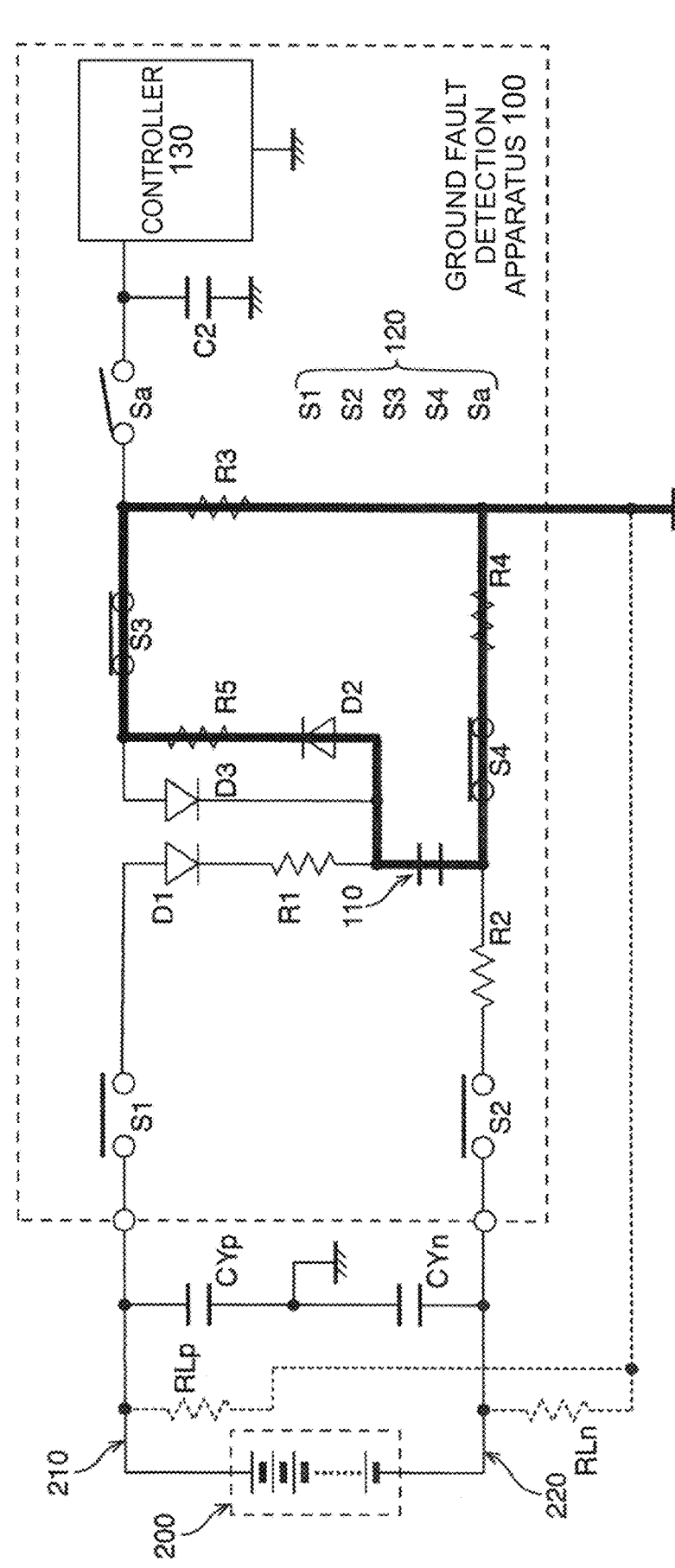
FIG. 7 is a view describing a discharging route.

As shown in FIG. 2, the switch portion 120 may be configured to further include a measurement switch Sa. In this manner, when the third switch S3, the fourth switch S4, and the measurement switch Sa are on, and the first switch S1 and the second switch S2 are off, as shown in FIG. 6, the measurement route for measuring the charging voltage of the first capacitor 110 is formed. Then, when the third switch S3 and the fourth switch S4 are on, and the first switch S1, the second switch S2, and the measurement switch Sa are off, as shown in FIG. 7, the discharging route in which the control portion 130 is separated from the first capacitor 110 for discharging the first capacitor 110 is formed. In the first charging route, the second charging route, and the third charging route, as shown in FIGS. 3-5, the measurement switch Sa are set to be off.

<Rapid Fluctuation in Charging Voltage of Battery 200>

In a case in which there is a rapid fluctuation occurred in the charging voltage of the battery 200, there is a case in which the decrease in the insulation resistances RLp and RLn is erroneously detected even though the insulation resistances RLp and RLn have not decreased, or the decrease in the insulation resistances RLp and RLn is not detected even though the insulation resistances RLp and RLn have decreased.

Therefore, the control portion 130 detects the decrease in the insulation resistance of the battery 200 based on the charging voltage of the first capacitor 110 which is measured when the fluctuation in the charging voltage of the battery 200 is small. That is, according to the present embodiment, the charging voltage of the first capacitor 110 which is measured when the fluctuation in the charging voltage of the battery 200 is large is not used in the detection for the decrease of the insulation resistance RLp, RLn.

The control portion 130 performs the detection for the decrease of the insulation resistances RLp, RLn per each measurement cycle. Then, the measurement cycle includes the first measurement period (V0 measurement period) for measuring the first charging voltage V0 corresponding to the charging voltage of the battery 200. Accordingly, for example, it is suitable to make the control portion 130 to perform the determination regarding whether the fluctuation of the first charging voltage V0 (for example, the fluctuation form the last measured first charging voltage V0 to the currently measured first charging voltage V0) is less than a first threshold value per each first measurement period. Then, it is suitable for the control portion 130 to perform the detection for the decrease in the insulation resistances RLp, RLn in the measurement cycle without including the first measurement period when the fluctuation of the first charging voltage V0 is equal to or greater than the first threshold value. That is, in the measurement cycle only including the first measurement periods when the fluctuation of the first charging voltage is determined to be less than the first threshold value, the control portion 130 performs the detection for the decrease in the insulation resistances RLp, RLn, and in the measurement cycle including the first measurement periods when the fluctuation of the first charging voltage is determined to be equal to or greater than the first threshold value, the control portion 130 does not perform the detection for the decrease in the insulation resistance RLp, RLn.

In this manner, it is possible to perform the detection for the decrease in the insulation resistances RLp, RLn without being affected by the rapid fluctuation of the charging voltage of the battery 200. As a result, according to the present embodiment, it is possible to prevent the false detection and the non-detection for the decrease in the insulation resistances RLp, RLn.

There are cases in which the rapid fluctuation in the charging voltage of the battery 200 occurs during the second measurement period (VC1n measurement period) and the third measurement period (VC1p measurement period). In a case in which the rapid fluctuation in the charging voltage of the battery 200 occurs during the second measurement period and the third measurement period, due to the rapid fluctuation in the charging voltage of the battery 200, there is a case in which the rapid fluctuation in the second charging voltage VC1n and the third charging voltage VC1p reflecting the effects of the insulation resistances RLn, RLp of the battery 200 respectively occurs.

Therefore, according to the present embodiment, per each measurement cycle, the control portion 130 performs the determination regarding whether the fluctuation in the second charging voltage VC1n (for example, the fluctuation from the second charging voltage VC1n that is measured during the last second measurement period to the second charging voltage VC1n that is measured during the current second measurement period) is less than a second threshold value during the second measurement period, and performs the determination regarding whether the fluctuation in the third charging voltage VC1p (for example, the fluctuation from the third charging voltage VC1p that is measured during the last third measurement period to the third charging voltage VC1p that is measured during the current third measurement period) is less than a third threshold value during the third measurement period.

Then, in the measurement cycle when the fluctuation in the second charging voltage VC In is determined to be less than the second threshold value, and the fluctuation in the third charging voltage VC1p is determined to be less than the third threshold value, it is suitable to cause the control portion 130 to perform the detection for the decrease in the insulation resistances RLp, RLn. That is, in the measurement cycle including the second measurement period when the fluctuation in the second charging voltage VC1n is equal to or greater than the second threshold value or the third measurement period when the fluctuation in the third charging voltage VC1p is equal to or greater than the third threshold value, it is suitable to prevent the control portion 130 from performing the detection for the decrease in the insulation resistances RLp, RLn.

In this manner, it is possible to perform the detection for the decrease in the insulation resistances RLp, RLn without being affected by the rapid fluctuation in the charging voltage of the battery 200. As a result, according to the present embodiment, it is possible to prevent the false detection and the non-detection for the decrease in the insulation resistances RLp, RLn.

In a case in which the detection for the decrease in the insulation resistances RLp, RLn is performed by other apparatus (for example, the superior ECU) and person, it is suitable to cause the control portion 130, in the measurement cycle including the second measurement period when the fluctuation in the second charging voltage VC1n is determined to be equal to or greater than the second threshold value or the third measurement period when the fluctuation in the third charging voltage VC1p is determined to be equal to or greater than the third threshold value, to notify the values of the insulation resistances RLp, RLn that are measured in the measurement cycle and to notify that there is a possibility that a rapid fluctuation in the charging voltage of the battery 200 occurred during the measurement cycle. In this manner, it is possible to perform the detection of the values of the insulation resistances RLp, RLn without using the values of the insulation resistances RLp, RLn which are measured in the measurement cycle when there is a possibility that a rapid fluctuation in the charging voltage of the battery 200 occurred during the measurement cycle in the detection for the decrease in the insulation resistances RLp, RLn. As a result, it is possible to perform the detection of the insulation resistances RLp, RLn without being affected by the rapid fluctuation in the charging voltage of the battery 200.

FIG. 8 is an example of processing operations that are executed in the ground fault detection apparatus 100 per each measurement cycle.

The control portion 130 measures the first charging voltage V0 during the first measurement period (Step S801). The control portion 130 determines whether the fluctuation in the first charging voltage V0 (the fluctuation from the last measured first charging voltage V0 to the currently measured first charging voltage V0) is less than the first threshold value (Step S802), and if the fluctuation in the first charging voltage V0 is not less than the first threshold (Step S802, NO), the control portion 130 set a first error flag (Step S803).

The control portion 130 measures the second charging voltage VC1n during the second measurement period (Step S804). The control portion 130 determines whether the fluctuation in the second charging voltage VC1n (the fluctuation from the last measured second charging voltage VC1n to the currently measured second charging voltage VC1n) is less than the second threshold value (Step S805), and if the fluctuation in the second charging voltage VC1n is not less than the second threshold (Step S805, NO), the control portion 130 set a second error flag (Step S806).

The control portion 130 measures the first charging voltage V0 during the first measurement period (Step S807). The control portion 130 determines whether the fluctuation in the first charging voltage V0 is less than the first threshold value (Step S808), and if the fluctuation in the first charging voltage V0 is not less than the first threshold (Step S808, NO), the control portion 130 set a third error flag (Step S809).

The control portion 130 measures the third charging voltage VC1p during the third measurement period (Step S810). The control portion 130 determines whether the fluctuation in the third charging voltage VC1p (the fluctuation from the last measured third charging voltage VC1p to the currently measured third charging voltage VC1p) is less than the third threshold value (Step S811), and if the fluctuation in the third charging voltage VC1p is not less than the third threshold (Step S811, NO), the control portion 130 set a fourth error flag (Step S812).

If neither of the first error flag to the fourth error flag is set (Step S813, YES), the control portion 130 performs the detection for the decrease in the insulation resistances RLp, RLn based on the first charging voltage V0, the second charging voltage VC1n, and the third charging voltage VC1p (Step S814). If any of the first error flag to the fourth error flag is set (Step S813, NO), the control portion 130 clears the error flag that is set and finished the processing (Step S815).

<Notification of Decrease in Insulation Resistances RLp, RLn>

In a case in which a number of the measurement cycles (that is, the measurement cycles in which the values of the insulation resistances RLp, RLn are decreased than the normal values of the insulation resistances RLp, RLn) in which the decrease of the insulation resistances RLp, RLn has been detected is a predetermined consecutive number (for example, three), the control portion 130 may be configured to notify the decrease in the insulation resistances RLp, RLn. At this time, in a case in which the values of the insulation resistances RLp, RLn which are measured in the measurement cycle (measurement cycle with fluctuation) including the first measurement period when the fluctuation in the first charging voltage is equal to or greater than the first threshold, the second measurement period when the fluctuation in the second charging voltage VC1n is equal to or greater than the second threshold, or the third measurement period when the fluctuation in the third charging voltage VC1p is equal to or greater than the third threshold are not used in the detection for the decrease in the insulation resistances RLp, RLn, there may be a case in which the notification of the decrease in the insulation resistances RLp, RLn is delayed.

For example, as shown in FIG. 9, in a predetermined number of measurement cycles (in the example shown in FIG. 9, three measurement cycles (the measurement cycle 3, the measurement cycle 4, the measurement cycle 5)) continuing with the measurement cycle with fluctuations (the measurement cycle 2), in a case in which the decrease in the insulation resistances RLp, RLn has been detected, there is a high probability that the insulation resistances RLp and RLn have decreased in the measurement cycle 2 as well. In a case in which the decrease in the insulation resistances RLp, RLn occurs in the measurement cycle 2, if the values of the insulation resistances RLp, RLn measured in the measurement cycle 2 are not used in the detection for the decrease in the insulation resistances RLp, RLn, compared with the case in which the values of the insulation resistances RLp, RLn measured in the measurement cycle 2 are used in the detection for the decrease in the insulation resistances RLp, RLn (see FIG. 10), the notification of the decrease in the insulation resistances RLp, RLn is delayed for only one measurement cycle.

According to the example shown in FIG. 9, the notification of the decrease in the insulation resistances RLp, RLn is performed after three consecutive measurement cycles without fluctuation (after the measurement cycle 5) in which the values of the insulation resistances RLp, RLn being lower than the values of the normal insulation resistances RLp, RLn are measured, on the other hand, according to the example shown in FIG. 10, regardless of the presence or absence of fluctuation, after three consecutive measurement cycles without fluctuation in which the values of the insulation resistances RLp, RLn being lower than the values of the normal insulation resistances RLp, RLn (after the measurement cycle 4), the notification of the decrease in the insulation resistances RLp and RLn is performed.

Therefore, in the case in which the decrease in the insulation resistances RLp, RLn is notified when there are predetermined number of consecutive measurement cycles in which the decrease of the insulation resistances RLp, RLn has been detected, it is suitable for the control portion 13 to use the values of the insulation resistances RLp, RLn which are measured in the measurement cycles (measurement cycle with fluctuation) including the first measurement period when the fluctuation of the first charging voltage is equal to or greater than the first threshold value, the second measurement period when the fluctuation of the second charging voltage VC1n is equal to or greater than the second threshold value, or the third measurement period when the fluctuation of the third charging voltage VC1p is equal to or greater than the third threshold value in the detection for the decrease in the insulation resistances RLp, RLn. In this manner, it is possible to prevent the delay of the notification of the decrease in the insulation resistances RLp, RLn.

The present invention has been described above using preferred embodiments of the present invention. Although the present invention has been described herein with reference to specific examples, various modifications and changes can be made to these examples without departing from the spirit and scope of the invention as set forth in the claims.

REFERENCE SIGNS LIST

100 ground fault detection apparatus
110 first capacitor
120 switching portion
130 control portion
200 battery
210 cathode-side power line
220 anode-side power line

12

What is claimed is:

1. A ground fault detection apparatus for detecting a decrease in an insulation resistance of a system including a battery that is not grounded, comprising:
    a first capacitor;
    a switching portion configured to switch among
        a first charging route in which the first capacitor is connected between a cathode and an anode of the battery without being connected to the ground,
        a second charging route in which the first capacitor is connected between the cathode of the battery and the ground,
        a third charging route in which the first capacitor is connected between the anode of the battery and the ground, and
        a measurement route for measuring a charging voltage of the first capacitor; and
    a control portion configured to control the switching portion to measure the charging voltage of the first capacitor,
    wherein the control portion is configured to
        for each measurement cycle, perform a determination regarding whether a fluctuation of a second charging voltage as the charging voltage of the first capacitor being charged by the second charging route is less than a second threshold value, and perform a determination regarding whether a fluctuation of a third charging voltage as the charging voltage of the first capacitor being charged by the third charging route is less than a third threshold value, and
        perform a detection for the decrease of the insulation resistance in the measurement cycle in which the fluctuation of the second charging voltage is determined to be less than the second threshold value and the fluctuation of the third charging voltage is determined to be less than the third threshold value.

2. The ground fault detection apparatus according to claim 1, wherein the measurement cycle includes
    a first measurement period to charge the first capacitor in the first charging route and measure a first charging voltage, which is the charging voltage of the first capacitor that is charged by the first charging route, in the measurement route,
    a second measurement period to charge the first capacitor in the second charging route and measure the second charging voltage in the measurement route, and
    a third measurement period to charge the first capacitor in the third charging route and measure the third charging voltage in the measurement route.

3. The ground fault detection apparatus according to claim 2, wherein the control portion is configured to
    notify a decrease in the insulation resistance when a number of consecutive measurement cycles in which the measured value of the insulation resistance is lowered than a normal value of the insulation resistance reaches a predetermined value, and
    use the value of the insulation resistance which is measured in the measurement cycle, including the second measurement period in which the fluctuation of the second charging voltage is equal to or greater than the second threshold value or the third measurement period in which the fluctuation of the third charging voltage is equal to or greater than the third threshold value, for a detection for the decrease in the insulation resistance.

4. The ground fault detection apparatus according to claim 2, wherein the control portion is configured to for each first measurement period, perform a determination regarding whether a fluctuation of the first charging voltage is less than a first threshold value, and perform a detection for the decrease in the insulation resistance in the measurement cycle without including the first measurement period in which the fluctuation of the first charging voltage is determined to be equal to or greater than the first threshold value.

5. The ground fault detection apparatus according to claim 4, wherein the control portion is configured to use a fluctuation from the first charging voltage that is measured last time to the first charging voltage that is currently measured as the fluctuation of the first charging voltage.

6. The ground fault detection apparatus according to claim 2, wherein the control portion is configured to in the second measurement period, use a fluctuation from the second charging voltage that is measured in the last second measurement period to the second charging voltage that is measured in the current second measurement period as a fluctuation of the second charging voltage, and in the third measurement period, use a fluctuation from the third charging voltage that is measured in the last third measurement period to the third charging voltage that is measured in the current third measurement period as a fluctuation of the third charging voltage.

7. A ground fault detection apparatus for measuring an insulation resistance of a system including a battery that is not grounded, comprising:

a first capacitor;

a switching portion configured to switch among a first charging route in which the first capacitor is connected between a cathode and an anode of the battery without being connected to the ground, a second charging route in which the first capacitor is connected to between the cathode of the battery and the ground, a third charging route in which the first capacitor is connected between the anode of the battery and the ground, and a measurement route for measuring a charging voltage of the first capacitor; and a control portion configured to control the switching portion, to measure the charging voltage of the first capacitor, and to measure a value of the insulation resistance for each measurement cycle based on the measured charging voltage of the first capacitor, wherein the measurement cycle includes a first measurement period to charge the first capacitor in the first charging route and measure a first charging voltage, which is the charging voltage of the first capacitor that is charged by the first charging route, in the measurement route, a second measurement period to charge the first capacitor in the second charging route and measure a second charging voltage, which is the charging voltage of the first capacitor that is charged by the second charging route, in the measurement route, and a third measurement period to charge the first capacitor in the third charging route and measure a third charging voltage, which is the charging voltage of the first capacitor that is charged by the second charging route, in the measurement route, and the control portion is configured to for each measurement cycle, perform a determination regarding whether a fluctuation of the second charging voltage is less than a second threshold value, and perform a determination regarding whether a fluctuation of the third charging voltage is less than a third threshold value, and notify that there is a possibility that a rapid fluctuation has occurred in the charging voltage of the battery in the measurement cycle including the second measurement period in which the fluctuation of the second charging voltage is determined to be equal to or greater than the second threshold value or the third measurement period in which the fluctuation of the third charging voltage is determined to be equal to or greater than the third threshold value.

8. The ground fault detection apparatus according to claim 7, wherein the control portion is configured to in the second measurement period, use a fluctuation from the second charging voltage that is measured in the last second measurement period to the second charging voltage that is measured in the current second measurement period as a fluctuation of the second charging voltage, and in the third measurement period, use a fluctuation from the third charging voltage that is measured in the last third measurement period to the third charging voltage that is measured in the current third measurement period as a fluctuation of the third charging voltage.

9. A control method of a ground fault detection apparatus for detecting a decrease in an insulation resistance of a system including a battery that is not grounded, the control method being executed by a computer, the ground fault detection apparatus comprising:

a first capacitor; and a switching portion configured to switch among a first charging route in which the first capacitor is connected between a cathode and an anode of the battery without being connected to the ground, a second charging route in which the first capacitor is connected between the cathode of the battery and the ground, a third charging route in which the first capacitor is connected between the anode of the battery and the ground, and a measurement route for measuring a charging voltage of the first capacitor, the control method comprising:

a measurement step of controlling the switching portion to measure a charging voltage of the first capacitor;

for each measurement cycle, a step of performing a determination regarding whether a fluctuation of a second charging voltage, that is the charging voltage of the first capacitor being charged by the second charging route, is less than a second threshold value, and performing a determination regarding whether a fluctuation of a third charging voltage, that is the charging voltage of the first capacitor being charged by the third charging route, is less than a third threshold value, and a step of detecting for the decrease of the insulation resistance in the measurement cycle in which the fluctuation of the second charging voltage is determined to be less than the second threshold value and the fluctuation of the third charging voltage is determined to be less than the third threshold value.

10. A non-volatile computer-readable recording medium recording an information processing program for making a computer to execute the control method according to claim 9.

* * * * *